(12) United States Patent
Oi

(10) Patent No.: US 6,452,173 B1
(45) Date of Patent: Sep. 17, 2002

(54) CHARGED PARTICLE APPARATUS

(75) Inventor: Masamichi Oi, Chiba (JP)

(73) Assignee: Seiko Instruments Inc. (JP)

( * ) Notice: Subject to any disclaimer, the term of this patent is extended or adjusted under 35 U.S.C. 154(b) by 0 days.

(21) Appl. No.: 09/315,717

(22) Filed: May 20, 1999

(30) Foreign Application Priority Data

May 21, 1998 (JP) .......................................... 10-140005

(51) Int. Cl.$^7$ ................................................ H01J 37/00
(52) U.S. Cl. ..................... 250/309; 250/310; 250/505.1
(58) Field of Search ................................ 250/309, 306, 250/505.1, 310, 396 R, 396 ML

(56) References Cited

U.S. PATENT DOCUMENTS

| 3,634,684 | A | * | 1/1972 | Sato ....................... 250/49.5 D |
| 3,984,687 | A | * | 10/1976 | Loeffler et al. |
| 4,209,701 | A | * | 6/1980 | Dietrich et al. |
| 4,214,166 | A | * | 7/1980 | Dietrich et al. |
| 5,029,249 | A | * | 7/1991 | Ohtaka |
| 5,149,968 | A | * | 9/1992 | Sato |
| 5,448,064 | A | * | 9/1995 | Matsuyama ................. 250/310 |
| 5,576,542 | A | * | 11/1996 | Kaga .......................... 250/310 |
| 6,297,512 | B1 | * | 10/2001 | Czapski .................... 250/515.1 |

FOREIGN PATENT DOCUMENTS

| JP | 4-76437 | 3/1992 |
| JP | 4115449 | 4/1992 |
| JP | 9-61385 | 3/1997 |

OTHER PUBLICATIONS

Patent Abstracts of Japan, publication NO. 05–314941, publication date Nov. 26, 1993.

\* cited by examiner

*Primary Examiner*—Kiet T. Nguyen
(74) *Attorney, Agent, or Firm*—Adams & Wilks

(57) ABSTRACT

A magnetism preventive cylinder is provided at a focused ion beam irradiating lens barrel tip, and an electricity preventive cylinder is mounted at an electron beam irradiating lens barrel tip. Also, the magnetism preventive cylinder is provided at the electron beam irradiating lens barrel tip in place of electricity preventive cylinder. The magnetism preventive cylinder at the focused ion beam irradiating lens barrel tip prevents a focused ion beam from being affected by a magnetic field from a focused ion beam. The electricity preventive cylinder at the electron beam irradiating lens barrel tip prevents against a magnetic field from the electron beam irradiating lens barrel tip.

20 Claims, 2 Drawing Sheets

CHARGED PARTICLE APPARATUS

BACKGROUND OF THE INVENTION

The present invention relates to a charged particle apparatus having a combination of a focused ion beam apparatus FIB (Focused Ion Beam) and a scanning electron microscope SEM (Scanning Electron Microscope). This is often used for defect observation on a semiconductor device.

Conventionally a charged particle apparatus combined with FIB and SEM has been disclosed in a publication of JP-A-2-123749. In FIG. 3, which shows the conventional apparatus, there are provided a focused ion beam irradiating lens barrel 1 for irradiating while scanning a focused ion beam 11 vertically to a sample surface and an electron beam irradiating lens barrel 2 for obliquely irradiating by scanning a focused electron beam 12 to a focused ion beam 11 scan-irradiating position of a sample 3. Secondary charged particles produced from the sample 3 surface in response to irradiation by the focused ion beam 11 are detected by a not-shown secondary charged particle detector. Based on the detection intensity, a sample 3 surface image is displayed on a not-shown CRT. Also, based on the sample 3 surface image displayed on the CRT, a scanning region of the focused ion beam 11 can be set to etch-remove a predetermined region of the sample 3 surface. That is, a sample section can be formed at a predetermined position of the sample 3 by repeatedly scanning/irradiating the focused ion beam 11.

A focused electron beam 12 from an electron beam irradiating lens barrel 2 is irradiated while scanning to a sample 3 section formed by the focused ion beam 11. Secondary particles produced from the sample section by irradiating the electron beam 12 are detected by a secondary charged particle detector 6. A sample section image is displayed on the CRT based on the detection intensity.

The secondary ray produced from the sample section due to the electron beam 12 irradiation is not limited to secondary charged particles such as secondary electrons but includes X-ray emission. By detecting an inherent or characteristic X-ray included in the emitted X ray, the sectional portion can be analyzed based on the ingredients or composition of the sample.

Generally, the lens for focusing an ion beam uses an electrostatic lens. A scanning electrode is used for applying an electric field perpendicular to a focused ion beam optical axis in order to scan a focused ion beam 11.

Also, generally, as for the electron beam 12, an electromagnetic coil is used to focus or deflection-scan by a magnetic field.

Generally, focused ion beam 11 irradiation and electron beam 12 irradiation are alternately operated with repetition.

After operating the electron beam 12 from the electron beam irradiating lens barrel 2, even if the irradiation of the electron beam 12 is stopped to render 0 a current flowing through the electromagnetic coil, the magnetic field for focusing and scanning the electron beam 12 caused by the electromagnetic coil is not completely reduced to 0 and some residual magnetic field remains. The remaining magnetic field is not always constant due to its operation hysteresis and is sometimes varying. Due to this, if a focused ion beam 11 from the focused ion beam irradiating lens barrel 1 is operated, the focused ion beam 11 is varied in path due to the remaining magnetic field. That is, not only the position of an observed image changes in each observation but also the forming region differs from a desired region. Also, the ions forming the focused ion beam 11 are generally formed by those with a different charge ratio. For example, ions of 1 valence, 2 valences and cluster ions. Due to this different charge ratio, the amount of deflection differs. Accordingly, the focused ion beam 11 apparently spreads. That is, there is a lowering in resolving power for the focused ion beam apparatus.

Also, the secondary charged particle detector 6 has an electric field formed at a secondary electron intake port in order to introduce the secondary charged particles produced from the sample 3 surface to the secondary charged particle detector. The electric field present at the secondary charged particle detector 6 causes unwanted deflection of the electron beam 12. Particularly, if the acceleration voltage for the electron beam 12 is switched, the amount of deflection (the amount the path is deflected) of the electron beam 12 differs to vary the position at which the electron beam 12 irradiates the sample. That is, even if the focused ion beam 11 irradiating position on the sample surface and the electron beam 12 irradiating position are brought into coincidence, when the acceleration voltage for the electron beam 11 is switched, deviation occurs in these positions. In particular, in the charged particle apparatus combined with FIB and SEM, there are many things arranged close to the sample 3 and the distance between the electron beam irradiating lens barrel 2 tip and the sample (working distance) increases. Accordingly, there is an increase in the deflection amount of the electron beam 12 due to the magnetic field from the secondary electron detector.

SUMMARY OF THE INVENTION

A magnetism preventive cylinder for shielding magnetism is provided at a tip of a focused ion beam irradiating lens barrel used to irradiate and scan a focused ion beam to a sample surface. Also, an electricity preventive cylinder for shielding an electric field is arranged at a tip of an electron beam irradiating lens barrel used to irradiate the sample surface.

On a focused ion beam path, the gap between the focused ion beam irradiating lens barrel tip and the sample surface is close to the electron beam irradiating lens barrel, so that a magnetic field from an electromagnetic coil of the electron beam irradiating lens barrel can adversely affect the path of the focused ion beam. The provision of the magnetism preventive cylinder at the focused ion beam irradiating lens barrel tip places at all times the focused ion beam irradiation position constant without being affected by residual magnetism. Also, there occurs no spread in the focused ion beam due to ion valence, thereby obtaining a microscopic spot and enhancing resolving power.

Furthermore, on the electron beam path, the gap between the electron beam irradiating lens barrel tip and the sample exposes the electron beam close to the secondary charged particle detector so that the electron beam path is adversely affected by the electric field for introducing the second charged particles of the secondary charged particle detector. The provision of the electricity preventive cylinder at the electron beam irradiating lens barrel tip decreases an exposure amount thereby reducing the electron beam deflection caused by the secondary charged particle detector. Even if the acceleration voltage for the electron beam is switched, the variation amount in the electron beam irradiation position is decreased.

DETAILED DESCRIPTION OF THE INVENTION

Figure 1:
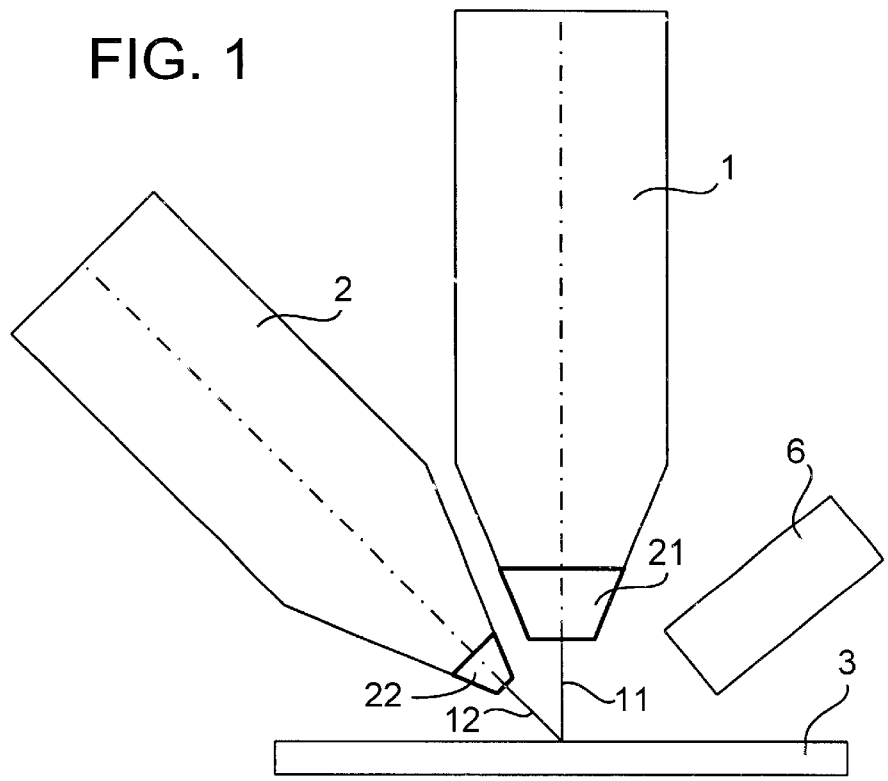
FIG. 1 is a principal sectional view of one embodiment of the present invention.

One embodiment of the present invention will be explained based on FIG. 1. A focused ion beam irradiating lens barrel is explained. The focused ion beam irradiating lens barrel 1 has, though not shown hereinunder, an ion source arranged at one end to produce a liquid metal ion beam. The focused ion beam irradiating lens barrel 1 has inside thereof an electrostatic lens for focusing ions around an ion beam axis into a focused ion beam 11, a scanning electrode for deflection-scanning the focused ion beam 11, and a blanker electrode for putting on/off irradiation of the focused ion beam 11. The focused ion beam irradiating lens barrel 1 produces a thinly focused ion beam 11 which is irradiated to a predetermined region of a surface of the sample 3. The focused ion beam irradiating lens barrel 1 has a cylindrical portion made of a non-magnetic material.

Also, explanation will be made of the electron beam irradiating lens barrel 2. The electron beam irradiating lens barrel 2 has therein a not-shown electron gun arranged at one end. Also, the electron beam irradiating lens barrel 2 has therein an electromagnetic coil for focusing and deflection-scanning the electron beam 12. The electron beam irradiating lens barrel 2 produces a thinly restricted electron beam 12 which is irradiated to a section of the sample 3 irradiated by the focused ion beam 11. That is, the focused ion beam irradiating lens barrel 1 and the electron beam irradiating lens barrel 2 are arranged such that respective beams 11, 12 from the focused ion beam irradiating lens barrel 1 and the electron beam irradiating lens barrel 2 are irradiated to nearly coincident positions of the sample 3. The electron beam irradiating lens barrel 2 is made of a magnetic material with a high permeability. This is because the magnetic field caused by the electromagnetic coil is efficiently formed in three dimensions.

Further, a magnetism preventive cylinder 21 for shielding magnetism is detachably mounted at a tip of the focused ion beam irradiating lens barrel 1 in a manner surrounding an optical axis of the focused ion beam 11. Although the magnetism preventive cylinder 21 may be formed of any suitable material that has a magnetism shielding property, permalloy is preferred. This is because there may be a case that an etching gas be introduced (such as when performing ion assist etching). Accordingly, permalloy is used due to a necessity of a certain degree of corrosion resistance. Due to the magnetism preventive cylinder 21, the magnetic field emanating from the electron beam irradiating lens barrel 2 is blocked and the range of the focused ion beam 11 is not affected by the magnetic field. Also, because the magnetism preventive cylinder 21 is detachably mounted at the focused ion beam irradiating lens barrel 1 tip, the magnetism preventive cylinder 21 if damaged by contact with the sample 3 or the like can be easily replaced.

Also, an electricity preventive cylinder 22 is mounted at a tip of the electron beam irradiating lens cylinder 2. As was explained before, the cylinder portion of the electron beam irradiating lens cylinder 2 is made of a high permeability material, and the electricity preventive cylinder 22 is made of a non-magnetic, electrically conductive material (e.g. aluminum, austenite based stainless steel, copper). Also, the electricity preventive cylinder 22 is in an electrical ground state and detachably mounted at the tip of the electron beam irradiating lens cylinder 2. The electricity preventive cylinder 22 is mounted at the tip of the electron beam irradiating lens cylinder 2. Accordingly, the electric field from the secondary charged particle detector 6 does not affect the electron beam 12. Reduced is the variation in electron beam 12 range due to switching the acceleration voltage for the electron beam 12. Also, because the electricity preventive cylinder 22 is detachably mounted at the electron beam irradiating lens barrel 2 tip, the electricity preventive cylinder 22 if damaged by contact with the sample 3 or the like can be readily replaced.

Figure 2:
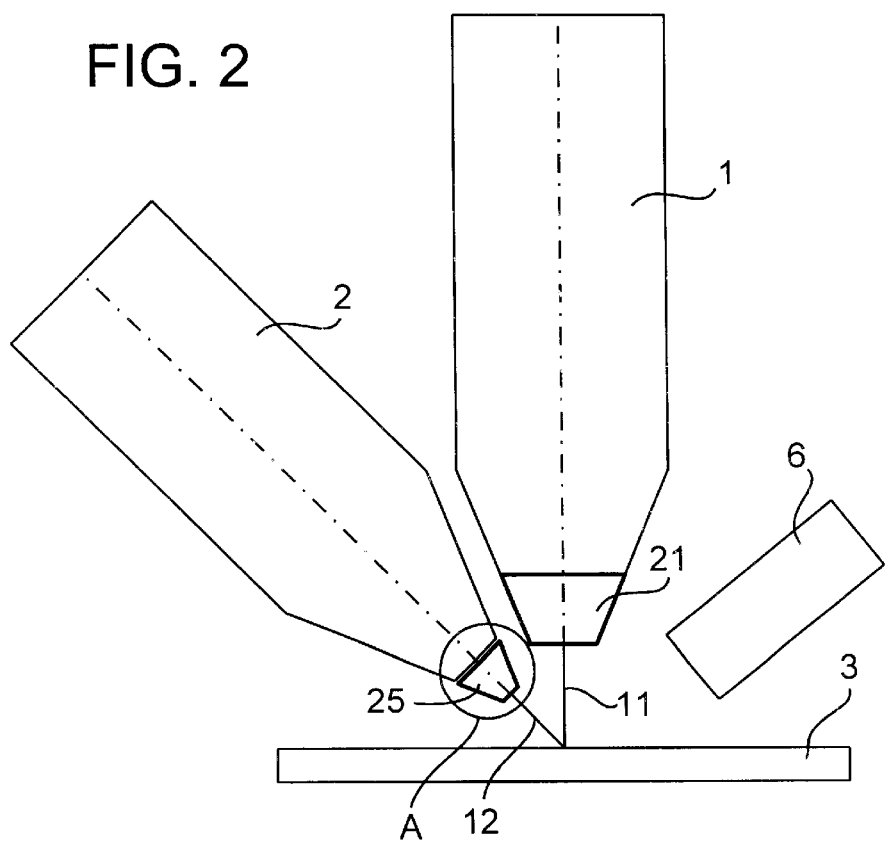
FIG. 2 is a principal sectional view of another embodiment of the present invention.
Figure 3:
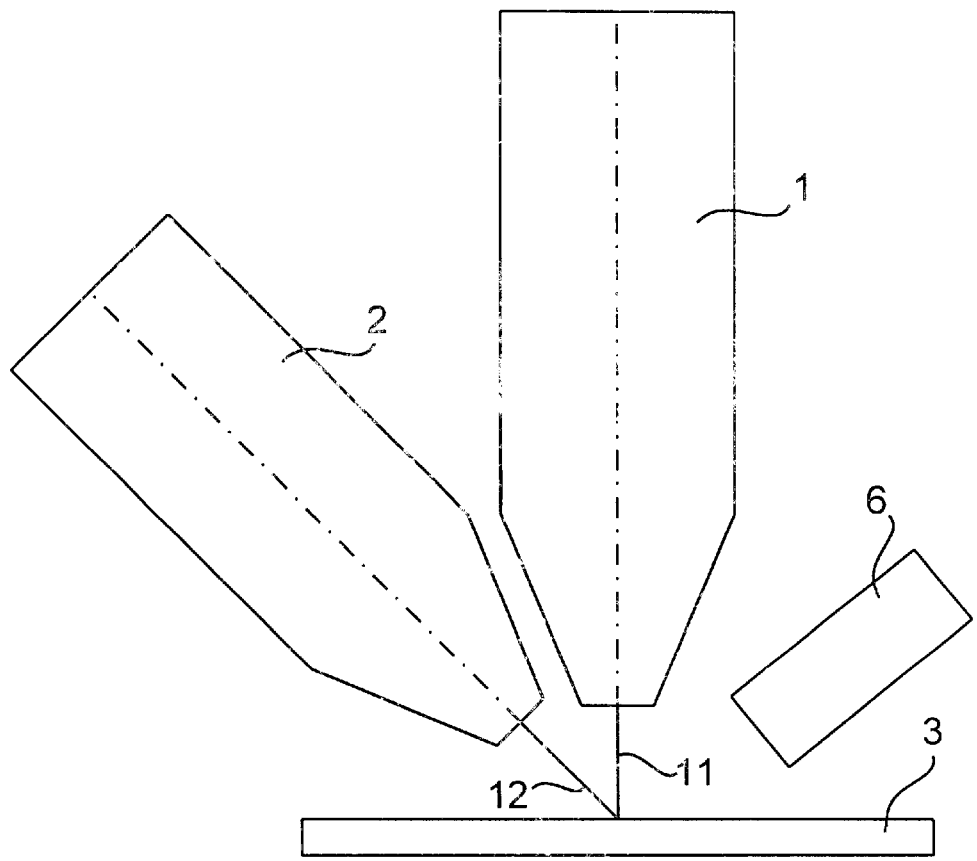
FIG. 3 is a principal sectional view of a conventional example.
Figure 4:
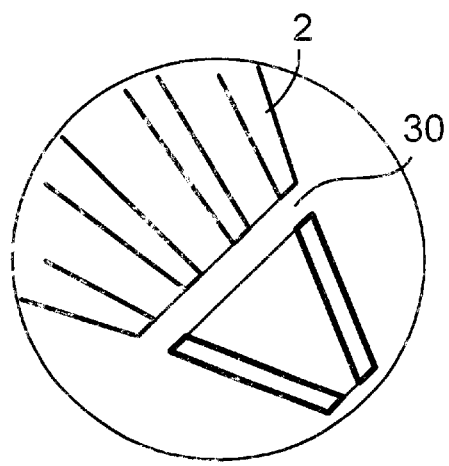
FIG. 4 is an enlarged sectional view of the circled portion A in FIG. 2.

Another embodiment will be explained based on FIG. 2. A focused ion beam irradiating lens barrel 1 and a magnetism preventive cylinder 21 detachably mounted at a tip thereof are the same as the embodiment shown in FIG. 1. There is a case that an electron beam irradiating lens barrel 2 uses a so-called magnetic field leak type electron beam irradiating lens barrel 2 in order to improve its resolving power. The magnetic field leak type electron beam irradiating lens barrel 2 is of a type that a magnetic field leaks outside from the barrel tip. This leaking magnetic field also contributes to electron beam 12 focusing or scanning. The magnetic field leaking outside from the tip of the electron beam irradiating lens barrel 2 is disturbed by the magnetism preventive cylinder 21 mounted at the tip of the focused ion beam irradiating lens barrel 1. The electron beam 12 has an increased non-pointability to cause irradiation point shift, causing spot diameter increase. Due to this, in the FIG. 2 embodiment a magnetism preventive cylinder 25 of a high permeable material for an electron beam irradiating lens barrel 25 is detachably mounted at a tip of the electron beam irradiating lens barrel 2. The electron beam irradiating lens barrel magnetism preventive cylinder 25 and the electron beam irradiating lens barrel 2 have a gap 30 magnetically provided therebetween as shown in FIG. 4. Because the leak magnetic field from the magnetic field leak type electron beam irradiating lens barrel 2 is controlled by the electron beam irradiating lens barrel magnetism preventive cylinder 25 and the gap 30 without impairing performance as an objective lens, there becomes no affection by the magnetism preventive cylinder 21 mounted at the tip of the focused ion beam irradiating lens barrel 1.

As described above, according to the present invention, in a charged particle apparatus combined with FIB and SEM, a magnetism preventive cylinder is provided at a tip of a focused ion beam irradiating lens barrel in a charged particle apparatus combined with FIB and SEM. Due to this, the focused ion beam is irradiated to a sample without being affected by a magnetic field caused from the electron beam irradiating lens barrel. Accordingly, there occurs no positional deviation or beam thickening. Also, an electricity preventive cylinder is provided at an electron beam irradiating lens barrel tip. Due to this, the electron beam can reduce the affect of the electric field produced from the secondary charged particle detector. Further, it is possible to prevent an electron beam irradiation position from shifting. Also, where the electron beam irradiating lens barrel is of a leak type, the electron beam irradiation position can be prevented from shifting without being affected by the magnetism preventive cylinder at the focused ion beam irradiating lens barrel tip by providing a magnetism preventive cylinder at the electron beam irradiating lens barrel tip.

What is claimed is:

1. A charged particle apparatus, comprising:
a non-magnetic focused ion beam irradiating lens barrel for irradiating a focused ion beam to an irradiating position on a sample surface;
an electron beam irradiating lens barrel made of a material having high magnetic permeability for irradiating an electron beam to the focused ion beam irradiating position on the sample surface;
a secondary charged particle detector for detecting secondary charged particles produced from the sample surface in response to irradiating the sample with the focused ion beam or the electron beam; and
a magnetism preventive cylinder formed of a material having high magnetic permeability and detachably mounted at a tip of the focus ion beam irradiating lens barrel to effectively prevent a magnetic field emanating from the electron beam irradiating lens barrel from affecting positioning of the focused ion beam.

2. A charged particle apparatus, comprising:
a non-magnetic focused ion beam irradiating lens barrel for irradiating a focused ion beam to an irradiating position on a sample surface;
an electron beam irradiating lens barrel made of a material having high magnetic permeability for irradiating an electron beam to the focused ion beam irradiating position on the sample surface;
a secondary charged particle detector for detecting secondary charged particles produced from the sample surface in response to irradiating the sample with the focused ion beam or the electron beam; and
an electricity preventive cylinder formed of a non-magnetic and electrically conductive material and detachably mounted at a tip of the electron beam irradiating lens barrel to effectively prevent electricity emanating from the secondary charged particle detector from affecting positioning of the electron beam.

3. A charged particle apparatus, comprising:
a non-magnetic focused ion beam irradiating lens barrel for irradiating a focused ion beam to an irradiating position on a sample surface;
an electron beam irradiating lens barrel made of a material having high magnetic permeability for irradiating an electron beam to the focused ion beam irradiating position on the sample surface;
a secondary charged particle detector for detecting secondary charged particles produced from the sample surface in response to irradiating the sample with the focused ion beam or the electron beam;
a magnetism preventive cylinder formed of a material having a high magnetic permeability and mounted at a tip of the focused ion beam irradiating lens barrel to effectively prevent a magnetic field emanating from the electron beam irradiating lens barrel from affecting positioning of the focused ion beam; and
an electron beam irradiating lens barrel magnetism preventive cylinder formed of a material having high magnetic permeability and detachably mounted at a tip of the electron beam irradiating lens barrel to effectively prevent the magnetic field emanating from the electron beam irradiating lens barrel from being affected by the magnetism preventive cylinder mounted at the tip of the focused ion beam irradiating lens barrel.

4. A charged particle apparatus according to claim 3; wherein the electron beam irradiating lens barrel magnetism preventive cylinder and the electron beam irradiating lens barrel have a gap therebetween.

5. A charged particle apparatus, comprising:
a first lens barrel assembly for producing and directing a focused ion beam to a desired position on a sample surface;
a second lens barrel assembly for producing and directing an electron beam to the desired position on the sample surface;
a secondary charged particle detector for detecting secondary charged particles emitted from the sample surface in response to irradiation thereof by the focused ion beam or the electron beam; and
a magnetism preventive cylinder detachably mounted at a tip of the first lens barrel assembly and having a sufficiently high magnetic permeability to magnetically shield the focused ion beam from a magnetic field emanating from the second lens barrel assembly.

6. A charged particle apparatus according to claim 5; wherein the first lens barrel assembly has a lens barrel comprised of non-magnetic material.

7. A charged particle apparatus according to claim 5; wherein the second lens barrel assembly has a lens barrel comprised of a material having high magnetic permeability.

8. A charged particle apparatus according to claim 5; wherein the magnetism preventive cylinder tapers inwardly in a direction toward the sample.

9. A charged particle apparatus according to claim 5; wherein the second lens barrel assembly comprises a magnetic field leak-type lens barrel assembly for producing and directing an electron beam to the desired position on the sample surface while leaking a magnetic field to outside the lens barrel assembly; and further comprising a magnetism preventive cylinder detachably mounted at a tip of the magnetic field leak-type lens barrel assembly to magnetically shield the magnetic field leaking therefrom from being affected by the magnetism preventive cylinder mounted at the tip of the first lens barrel assembly.

10. A charged particle apparatus according to claim 9; wherein both of the magnetism preventive cylinders taper inwardly in a direction toward the sample.

11. A charged particle apparatus according to claim 10; further including means defining a gap between the tip of the magnetic field leak-type lens barrel assembly and the magnetism preventive cylinder mounted at the tip thereof.

12. A charged particle apparatus according to claim 9; further including means defining a gap between the tip of the magnetic field leak-type lens barrel assembly and the magnetism preventive cylinder mounted at the tip thereof.

13. A charged particle apparatus according to claim 9; wherein the first lens barrel assembly has a lens barrel comprised of non-magnetic material.

14. A charged particle apparatus according to claim 9; wherein the second lens barrel assembly has a lens barrel comprised of a material having high magnetic permeability.

15. A charged particle apparatus, comprising:
a first lens barrel assembly for producing and directing a focused ion beam to a desired position on a sample surface;
a second lens barrel assembly for producing and directing an electron beam to the desired position on the sample surface;
a secondary charged particle detector for detecting secondary charged particles emitted from the sample surface in response to irradiation thereof by the focused ion beam or the electron beam; and an electricity preventive cylinder detachably mounted at a tip of the second lens barrel assembly and being formed of a non-magnetic, electrically conductive material to electrically shield the electron beam from an electric field emanating from the secondary charged particle detector.

16. A charged particle apparatus according to claim 15; wherein the electricity preventive cylinder tapers inwardly in a direction toward the sample.

17. A charged particle apparatus according to claim 15; further including a magnetism preventive cylinder detachably mounted at a tip of the first lens barrel assembly and having a sufficiently high magnetic permeability to magnetically shield the focused ion beam from a magnetic field emanating from the second lens barrel assembly.

18. A charged particle apparatus according to claim 17; wherein he electricity preventive cylinder and the magnetism preventive cylinder each tapers inwardly in a direction toward the sample.

19. A charged particle apparatus according to claim 18; wherein the second lens barrel assembly has a lens barrel comprised of a material having high magnetic permeability.

20. A charged particle apparatus according to claim 15; wherein the first lens barrel assembly has a lens barrel comprised of non-magnetic material.

* * * * *